United States Patent
Pelella et al.

(10) Patent No.: US 7,211,473 B1
(45) Date of Patent: May 1, 2007

(54) METHOD AND STRUCTURE FOR CONTROLLING FLOATING BODY EFFECTS

(75) Inventors: Mario M. Pelella, Mountain View, CA (US); William George En, Milpitas, CA (US); Ping-Chin Yeh, San Jose, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 417 days.

(21) Appl. No.: 10/756,585

(22) Filed: Jan. 12, 2004

(51) Int. Cl.
*H01L 21/00* (2006.01)

(52) U.S. Cl. .............. 438/149; 438/479; 257/327; 257/374; 257/368

(58) Field of Classification Search ......... 257/347, 257/368, 327; 438/149, 479, 517
See application file for complete search history.

(56) References Cited

U.S. PATENT DOCUMENTS

| 5,578,865 | A | | 11/1996 | Vu et al. |
| 6,001,726 | A | * | 12/1999 | Nagabushnam et al. .... 438/618 |
| 6,479,866 | B1 | | 11/2002 | Xiang |
| 6,797,556 | B2 | * | 9/2004 | Murthy et al. .............. 438/231 |

OTHER PUBLICATIONS

Campbell, Stephen A. 1996, Oxford University Press, The Science and Engineering of Microelectronic Fabrication, p. 354.*

* cited by examiner

*Primary Examiner*—Douglas W. Owens
(74) *Attorney, Agent, or Firm*—Mikio Ishimaru

(57) ABSTRACT

A method for forming an integrated circuit with a semiconductor substrate is provided. A gate dielectric is formed on the semiconductor substrate, and a gate is formed on the gate dielectric. Source/drain junctions are formed in the semiconductor substrate adjacent the gate. A facet is formed in at least one of the source/drain junctions of the integrated circuit.

20 Claims, 4 Drawing Sheets

METHOD AND STRUCTURE FOR CONTROLLING FLOATING BODY EFFECTS

BACKGROUND

1. Technical Field

The present invention relates generally to semiconductor technology, and more specifically to semiconductor-on-insulator constructions that control floating body effects.

2. Background Art

At the present time, electronic products are used in almost every aspect of life, and the heart of these electronic products is the integrated circuit. Integrated circuits are used in everything from airplanes and televisions to wristwatches.

Integrated circuits are made in and on silicon wafers by extremely complex systems that require the coordination of hundreds or even thousands of precisely controlled processes to produce a finished semiconductor wafer. Each finished semiconductor wafer has hundreds to tens of thousands of integrated circuits, each wafer worth hundreds or thousands of dollars.

Integrated circuits are made up of hundreds to millions of individual components. One common component is the semiconductor transistor. The most common and important semiconductor technology presently used is silicon-based, and the most preferred silicon-based semiconductor device is a complementary metal oxide semiconductor ("CMOS") transistor.

The principal elements of a CMOS transistor generally consist of a silicon substrate having shallow trench oxide isolation regions cordoning off transistor areas. The transistor areas contain polysilicon gates on silicon oxide gates, or gate oxides, over the silicon substrate. The silicon substrate on both sides of the polysilicon gate is slightly doped to become conductive. These lightly doped regions of the silicon substrate are referred to as "shallow source/drain junctions", which are separated by a channel region beneath the polysilicon gate. A curved silicon oxide or silicon nitride spacer, referred to as a "sidewall spacer", on the sides of the polysilicon gate allows deposition of additional doping to form more heavily doped regions of the shallow source/drain ("S/D") junctions, which are called "deep S/D junctions".

To complete the transistor, a silicon oxide dielectric layer is deposited to cover the polysilicon gate, the curved spacer, and the silicon substrate. To provide electrical connections for the transistor, openings are etched in the silicon oxide dielectric layer to the polysilicon gate and the S/D junctions. The openings are filled with metal to form electrical contacts. To complete the integrated circuits, the contacts are connected to additional levels of wiring in additional levels of dielectric material to the outside of the dielectric material.

In operation, an input signal to the gate contact to the polysilicon gate controls the flow of electric current from one S/D contact through one S/D junction through the channel to the other S/D junction and to the other S/D contact.

Transistors are fabricated by thermally growing a gate oxide layer on the silicon substrate of a semiconductor wafer and forming a polysilicon layer over the gate oxide layer. The oxide layer and polysilicon layer are patterned and etched to form the gate oxides and polysilicon gates, respectively. The gate oxides and polysilicon gates in turn are used as masks to form the shallow S/D regions by ion implantation of boron or phosphorus impurity atoms into the surface of the silicon substrate. The ion implantation is followed by a high-temperature anneal above 700° C. to activate the implanted impurity atoms to form the shallow S/D junctions.

A silicon nitride layer is deposited and etched to form sidewall spacers around the side surfaces of the gate oxides and polysilicon gates. The sidewall spacers, the gate oxides, and the polysilicon gates are used as masks for the conventional S/D regions by ion implantation of boron or phosphorus impurity atoms into the surface of the silicon substrate into and through the shallow S/D junctions. The ion implantation is again followed by a high-temperature anneal above 700° C. to activate the implanted impurity atoms to form the S/D junctions.

After formation of the transistors, a silicon oxide dielectric layer is deposited over the transistors and contact openings are etched down to the S/D junctions and to the polysilicon gates. The contact openings are then filled with a conductive metal and interconnected by formation of conductive wires in other interlayer dielectric ("ILD") layers.

As transistors and integrated circuit dimensions have decreased in size and increased in operating speeds, specialized fabrication architectures and technologies have evolved to enable these capabilities. One such technology, called semiconductor-on-insulator ("SOI"), has a base semiconductor substrate layer (such as silicon); a buried insulating layer (such as silicon oxide) over the semiconductor substrate layer; and an upper semiconductor region over the buried insulating layer. Circuitry is then formed in the upper semiconductor region.

An SOI device formed on such an SOI substrate is then completely isolated by the buried oxide layer. This reduces junction capacitance, achieves low power consumption, and enables very high speed operation. For example, metal oxide semiconductor field effect transistors ("MOSFETs") are well known in the field of semiconductors. SOI MOSFETs have been demonstrated to be superior to bulk silicon MOSFETs in low-power, high-speed, very large scale integration ("VLSI") applications.

SOI devices have often been dubbed as the successor to the reigning bulk silicon CMOS field effect transistor ("FET") devices. SOI device advantages include excellent device isolation (protecting against cross talk), almost null leakage, latch-up immunity, dynamic coupling, reduced short-channel effects, improved radiation hardness, lower parasitic junction capacitance (enabling higher circuit speed), reduced junction leakage currents, lower power consumption, and simplified device isolation and fabrication.

Attention is thus now focused on SOI metal oxide semiconductor ("MOS") transistors as high-speed, low-power devices. However, one problem with forming FETs on an SOI wafer is the floating body effect ("FBE"). The FBE occurs because the buried oxide layer isolates the channel, or body, of the transistor from the fixed electrical potential of the silicon substrate. The transistor body therefore takes on a charge based on recent operation of the transistor.

Since the body of a conventional SOI MOS transistor is in an electrically floating state, a parasitic bipolar effect is produced. This causes the charge carriers (holes in nMOSFETs and electrons in pMOSFETs) that are regularly generated during circuit operation to accumulate near the source/body junctions of the MOSFET. Eventually, sufficient carriers will accumulate to electrically forward bias the transistor body with respect to the source. The FBE then causes the current-to-voltage curve for the transistor to distort or kink, which in turn causes the threshold voltage for operating the transistor to fluctuate.

A threshold voltage that is lowered by this effect causes extra current to start flowing, resulting in a "kink" in the transistor's electrical characteristics. In analog circuits, the extra current flow reduces the achievable gain and dynamic swing. In digital circuits, the extra current flow gives rise to an abnormality in the transfer characteristics. Additionally, the FBE causes higher device leakages, undesirable transient effects, and can cause circuit instability and device malfunction.

One attempted solution for the FBE is to provide a contact to the transistor body to collect and remove the hole current. However, currently available hole collection schemes, including the use of a side contact or a mosaic source, are inefficient and consume significant amounts of wafer area. Complex transistor designs are therefore often required to reduce the FBE. For example, substrate contact schemes, such as a low barrier body contact ("LBBC"), have been utilized to provide a contact for current collection for the SOI substrate, thereby reducing the FBE. However, providing substrate contacts on an SOI substrate requires space and can add process complications.

Accordingly, there is a strong continuing need for a semiconductor circuit structure, and a method for forming such a structure, that includes the low junction capacitance and low "off" state leakage characteristics of SOI FET based circuits, but does not suffer the disadvantages of a floating body potential. In particular, there exists a strong need for an uncomplicated and inexpensive SOI structure that can remove extra carriers, such as by promoting carrier recombination, thereby removing charges from the channel and reducing the floating body effect.

Solutions to these problems have been long sought but prior developments have not taught or suggested any solutions and, thus, solutions to these problems have long eluded those skilled in the art.

DISCLOSURE OF THE INVENTION

The present invention provides a method for forming an integrated circuit that reduces floating body effects. A semiconductor substrate is provided, and a gate dielectric is formed on the semiconductor substrate. A gate is formed on the gate dielectric, and source/drain junctions are formed in the semiconductor substrate adjacent the gate. A facet is formed in at least one of the source/drain junctions of the integrated circuit. The facet removes extra carriers by promoting carrier recombination, thereby removing charges from the channel and reducing the floating body effect.

Certain embodiments of the invention have other advantages in addition to or in place of those mentioned above. The advantages will become apparent to those skilled in the art from a reading of the following detailed description when taken with reference to the accompanying drawings.

DETAILED DESCRIPTION OF THE INVENTION

Figure 1:
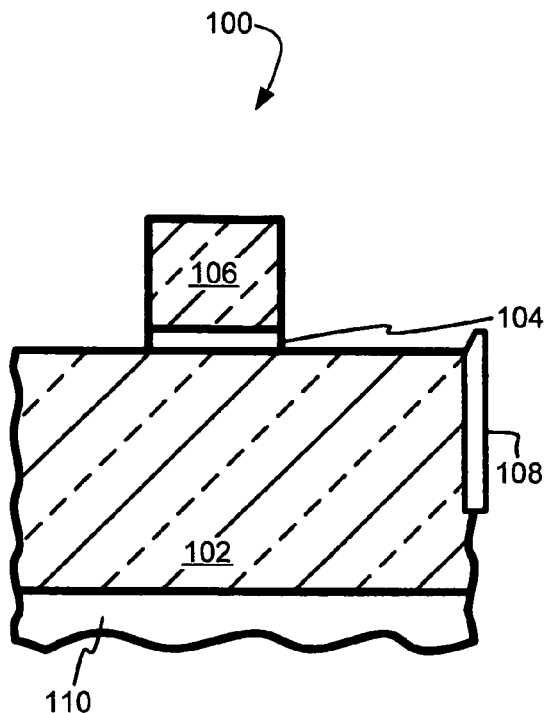
FIG. 1 is a view of a transistor in an intermediate stage of fabrication in accordance with the present invention.

In the following description, numerous specific details are given to provide a thorough understanding of the invention. However, it will be apparent to one skilled in the art that the invention may be practiced without these specific details. In order to avoid obscuring the present invention, some well-known configurations and process steps are not disclosed in detail. In addition, the drawings showing embodiments of the apparatus are semi-diagrammatic and not to scale and, particularly, some of the dimensions are for the clarity of presentation and may be exaggerated in the drawing FIGs. The same numbers will be used in all the drawing FIGs. to relate to the same elements.

The term "horizontal" as used herein is defined as a plane parallel to a substrate or wafer. The term "vertical" refers to a direction perpendicular to the horizontal as just defined. Terms, such as "on", "above", "below", "bottom", "top", "side" (as in "sidewall"), "higher", "lower", "over", and "under", are defined with respect to the horizontal plane.

Field effect transistor ("FET") metal oxide semiconductor ("MOS") devices formed on a semiconductor-on-insulator ("sor") wafer are subject to performance degradation due to the floating body effect ("FBE"). The FBE occurs because the SOI buried oxide layer isolates the channel, or body, of the transistor from the fixed electrical potential of the silicon substrate. The electrical isolation of the transistor body allows it to take on a charge based on recent operation of the transistor.

The FBE is caused by impact ionization in the channel region during on-state operation. The impact ionization typically occurs near the drain side of the channel region. Majority carriers accumulate in the body of the SOI transistor. More specifically, holes (for n-type SOI MOS transistors) or electrons (for p-type SOI MOS transistors) are accumulated in the vicinity of the source, whereby a parasitic bipolar transistor comprised of source, body, and drain enters into its active state.

The accumulation of carriers increases the potential between the channel region and the drain region. The increased potential reduces the threshold voltage of the transistor, thereby adversely affecting its stability and power consumption. A reduced transistor threshold voltage also increases its off-state and on-state currents. Floating body effects can cause sharp increases in the relationship between drain current and drain voltage (the so-called "kink effect"), anomalous sub-threshold current, transient current overshoot, and early device voltage VDS breakdown.

One solution for the FBE is to increase the impurity concentration in the channel region to suppress reduction in the threshold voltage of the SOI MOS transistor due to the parasitic bipolar effect. However, such an approach degrades current driving capability and speed performance of the transistor.

The present invention overcomes these limitations and difficulties by providing a semiconductor circuit structure, and a method for forming such a structure, that removes charges from the channel by promoting carrier recombination of extra carriers therein, thereby reducing the floating body effect.

Referring now to FIG. 1, therein is shown an integrated circuit, such as a transistor 100, in an intermediate stage of fabrication in accordance with the present invention. To form the intermediate stage, a gate dielectric layer, such as silicon oxide, and a conductive gate layer, such as polysilicon, have been deposited on a semiconductor substrate 102 of a material such as silicon. The layers are patterned and etched to form a gate dielectric 104 and a gate 106. The semiconductor substrate 102 has been further patterned, etched, and filled with a silicon oxide material to form a shallow trench isolation ("STI") 108. The semiconductor substrate 102 is the top layer of a semiconductor-on-insulator ("SOI") wafer, and is thus located over an intermediate insulating buried oxide ("BOX") layer 110.

Figure 2:
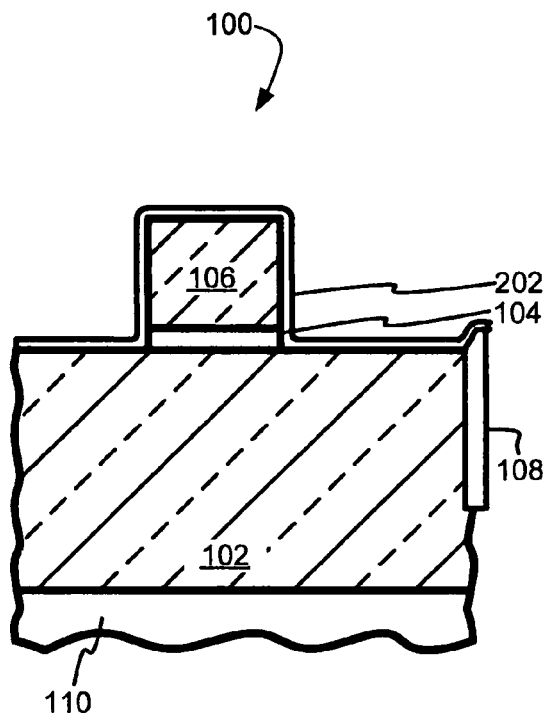
FIG. 2 is the structure of FIG. 1 with a liner layer deposited thereon.

Referring now to FIG. 2, therein is shown the structure of FIG. 1 having a liner layer 202 deposited thereon. The liner layer 202, generally of silicon oxide, covers the semiconductor substrate 102, the gate dielectric 104, the gate 106, and the STI 108. The liner layer 202 can be of an etch stop material or an implant-protection material.

Figure 3:
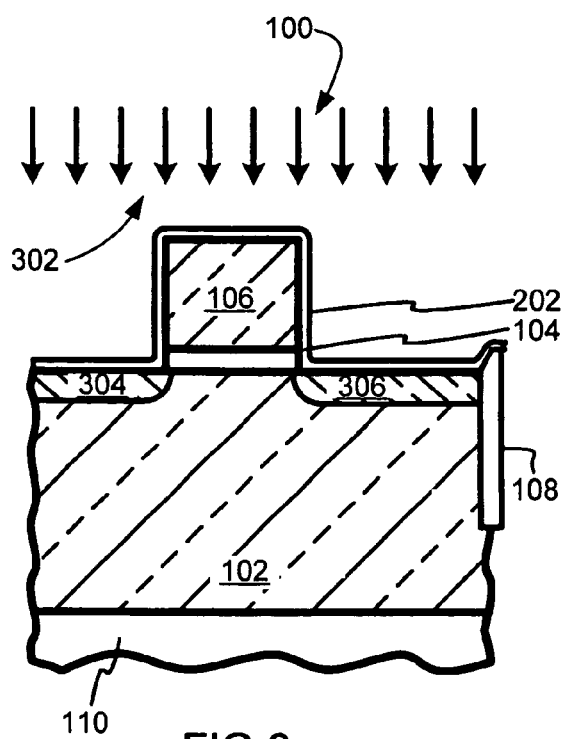
FIG. 3 is the structure of FIG. 2 during ion implantation to form shallow source/drain junctions.

Referring now to FIG. 3, therein is shown the structure of FIG. 2 during an ion implantation 302 to form shallow source/drain ("S/D") junctions 304 and 306 adjacent the gate 106. The gate 106 and the gate dielectric 104 act as masks for the formation of the shallow S/D junctions 304 and 306 by the ion implantation 302 of boron (B) or phosphorus (P) impurity atoms into the surface of the semiconductor substrate 102. The ion implantation 302 is followed by a high-temperature anneal above 700° C. to activate the implanted impurity atoms to form the shallow S/D junctions 304 and 306.

Figure 4:
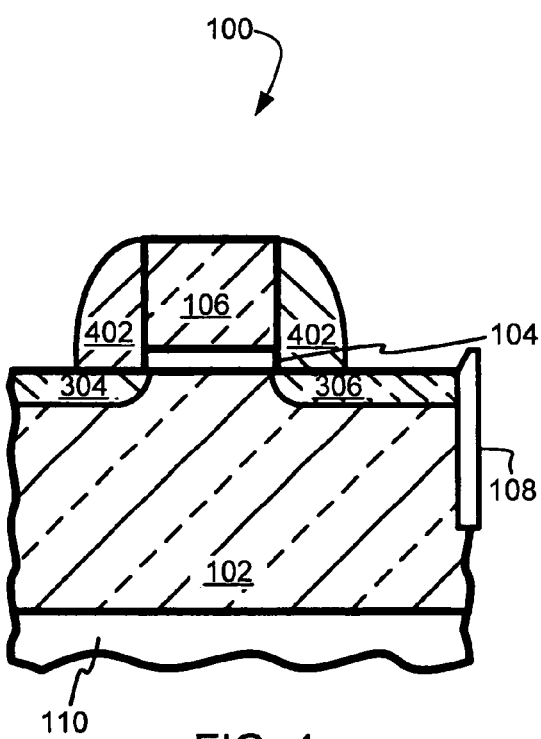
FIG. 4 is the structure of FIG. 3 after formation of a sidewall spacer.

Referring now to FIG. 4, therein is shown the structure of FIG. 3 after formation of a curved sidewall spacer 402. The liner layer 202, which protects from implant damage, has been removed and a sidewall spacer layer, generally of silicon nitride, has been deposited and etched to form the curved shape of the curved sidewall spacer 402.

Figure 5:
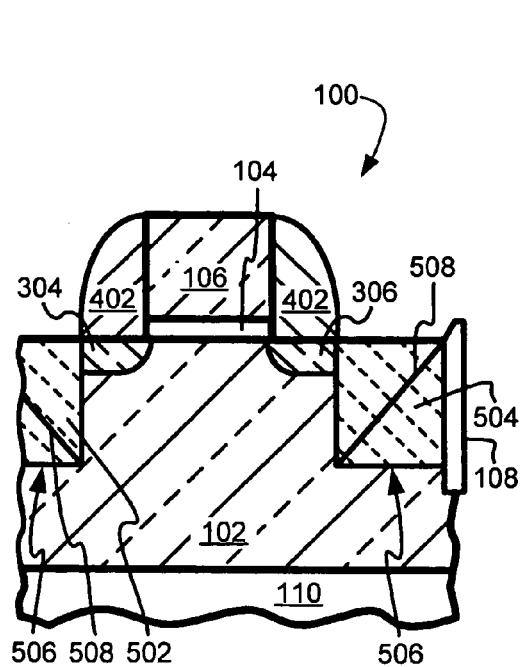
FIG. 5 is the structure of FIG. 4 after etching and filling of the semiconductor substrate to form deep source/drain junction regions.

Referring now to FIG. 5, therein is shown the structure of FIG. 4 after etching and filling of the semiconductor substrate 102 to form deep S/D junction regions 502 and 504 extending through the shallow S/D junctions 304 and 306 and away from either side of the sidewall spacer 402. The deep S/D junction regions 502 and 504 are formed, following etching of the semiconductor substrate 102, by selective epitaxial growth ("SEG") to replace or regrow the semiconductor substrate by filling crystalline material in the etched regions 506.

During refilling of the etched regions 506 for the deep S/D junction regions 502 and 504, the SEG regrowth rates are unequal in the horizontal and vertical directions. This unequal growth rate causes formation therein of a facet 508 containing defects in the crystalline structure. The defects in the facet 508 then serve to increase the recombination rate of excess carriers in the transistor channel, thereby reducing the carrier lifetimes and correspondingly reducing the FBE.

Figure 6:
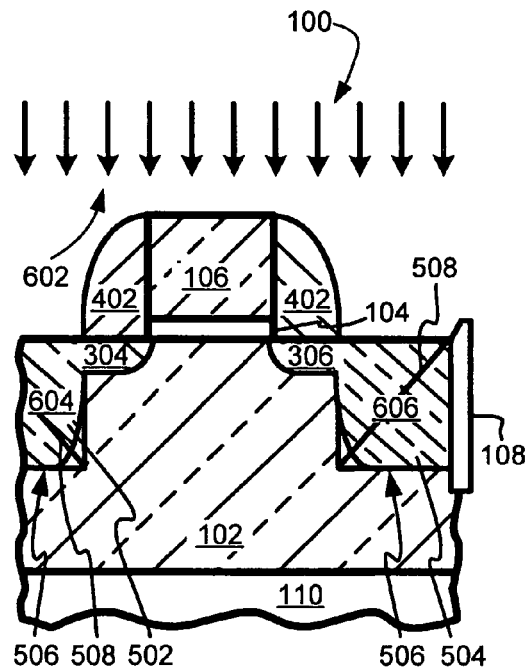
FIG. 6 is the structure of FIG. 5 during ion implantation to form deep source/drain junctions.

Referring now to FIG. 6, therein is shown the structure of FIG. 5 during an ion implantation 602 to form deep S/D junctions 604 and 606 in the deep S/D junction regions 502 and 504. The sidewall spacer 402, the gate 106, and the STI 108 act as masks for the ion implantation, typically of boron or phosphorus impurity atoms, into the SEG regrowth in the deep S/D junction regions 502 and 504. Optionally, the SEG may be performed with a doped epitaxial material, so that the deep S/D junction regions 502 and 504 (the semiconductor substrate epitaxial growth) are doped to augment the ion implantation 602.

The ion implantation 602 is then followed by a high-temperature anneal above 700° C. to activate the implanted impurity atoms for the deep S/D junctions 604 and 606.

Figure 7:
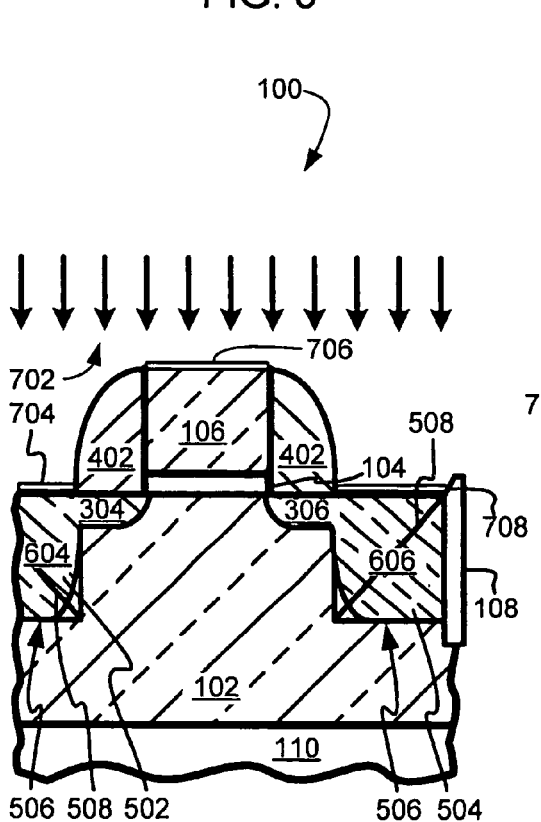
FIG. 7 is the structure of FIG. 6 during the formation of silicide.

Referring now to FIG. 7, therein is shown a deposition process 702 used in the formation of silicide layers 704, 706, and 708 in accordance with the present invention. The silicide layers 704 and 708 are formed with the surface of the semiconductor substrate 102 over the deep S/D junctions 604 and 606, respectively, and the silicide layer 706 is formed on the gate 106.

Figure 8:
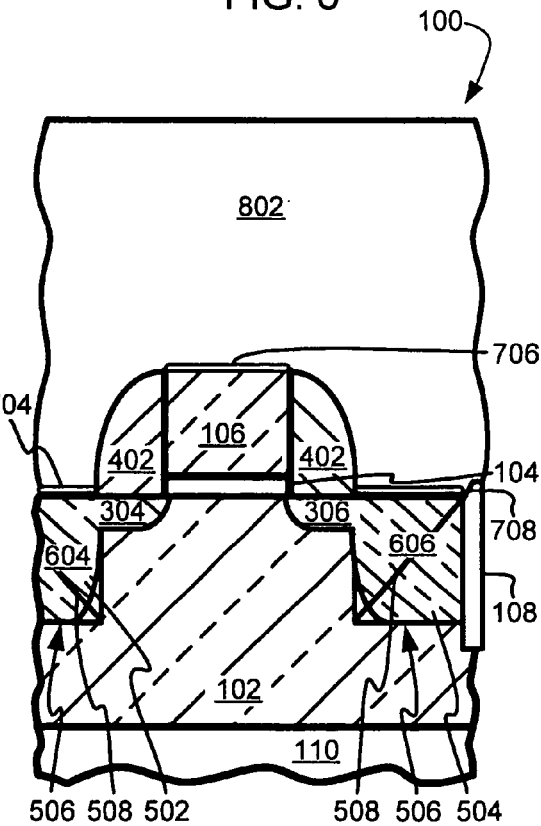
FIG. 8 is the structure of FIG. 7 after deposition of a dielectric layer over the silicide, the sidewall spacer, and the shallow trench isolation.

Referring now to FIG. 8, therein is shown the structure of FIG. 7 after deposition of a dielectric layer 802 over the silicide layers 704, 706, and 708, the sidewall spacer 402, and the STI 108.

In various embodiments, the dielectric layer 802 is of dielectric materials such as silicon oxide ($SiO_x$), tetraethylorthosilicate (TEOS), borophosphosilicate (BPSG) glass, etc., with dielectric constants from 4.2 to 3.9, or low dielectric constant dielectric materials such as fluorinated tetraethylorthosilicate (FTEOS), hydrogen silsesquioxane (HSQ), bis-benzocyclobutene (BCB), tetramethylorthosilicate (TMOS), octamethyleyclotetrasiloxane (OMCTS), hexamethyldisiloxane (HMDS), trimethylsilil borxle (SOB), diaceloxyditerliarybutosiloxane (DADBS), trimethylsilil phosphate (SOP), etc., with dielectric constants below 3.9 to 2.5. Available ultra-low dielectric constant dielectric materials, having dielectric constants below 2.5, include commercially available Teflon-AF, Teflon microemulsion, polimide nanofoams, silica aerogels, silica xerogels, and mesoporous silica. Stop layers and capping layers (where used) are of materials such as silicon nitride ($Si_xN_x$) or silicon oxynitride (SiON).

Figure 9:
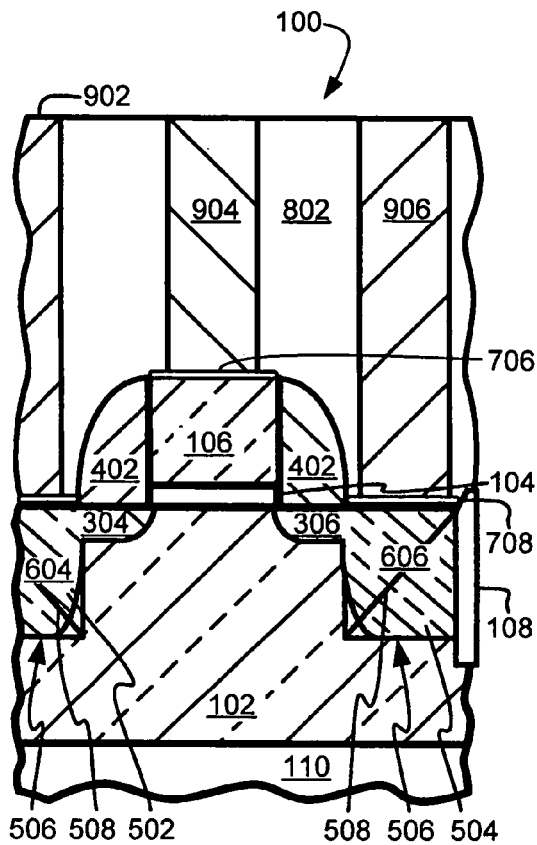
FIG. 9 is the structure of FIG. 8 after formation of metal contacts.

Referring now to FIG. 9, therein is shown the structure of FIG. 8 after formation of metal contacts 902, 904, and 906. The metal contacts 902, 904, and 906 are respectively electrically connected to the silicide layers 704, 706, and 708, and respectively to the deep S/D junction 604, the gate 106, and the deep S/D junction 606.

In various embodiments, the metal contacts 902, 904, and 906 are of metals such as tantalum (Ta), titanium (Ti), tungsten (W), alloys thereof, and compounds thereof. In other embodiments, the metal contacts 902, 904, and 906 are of metals such as copper (Cu), gold (Au), silver (Ag), alloys thereof, and compounds thereof with one or more of the above elements with diffusion barriers around them.

The metal contacts 902 and 906 only contact the respective deep S/D junctions 604 and 606. The portion of the semiconductor substrate 102 between the deep S/D junctions 604 and 606 (that is, the transistor body region) is electrically isolated vertically by the BOX layer 110 and horizontally by the deep S/D junctions 604 and 606; hence the floating-body region. The voltage in this isolated transistor floating-body region therefore varies with the terminal voltages applied to the source region, the drain region, and the gate of the transistor, and varies due to generated excess carriers via impact ionization, thermal generation, and gate tunneling mechanisms. However, the facet 508 accelerates recombination of excess carriers in the transistor floating-body region, thereby reducing carrier lifetimes and correspondingly reducing the FBEs in this region.

Figure 10:
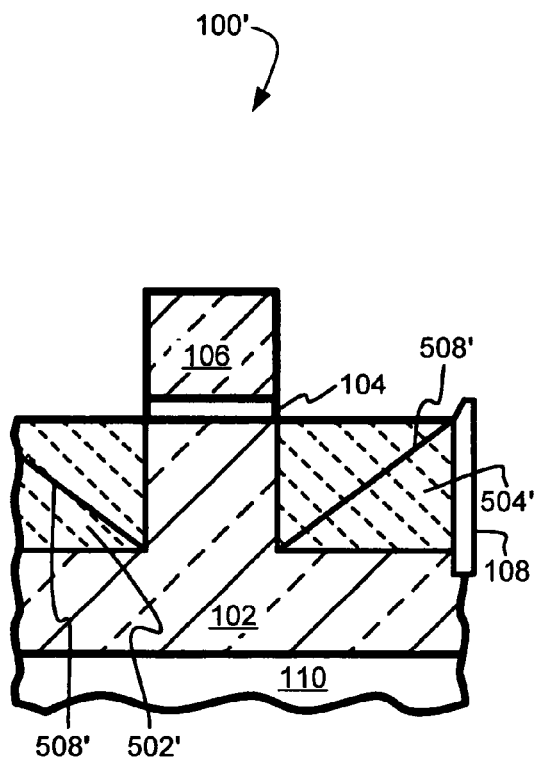
FIGS. 10, 11, and 12 show a variation on the method for forming the deep S/D junction regions of the transistor.
Figure 11:
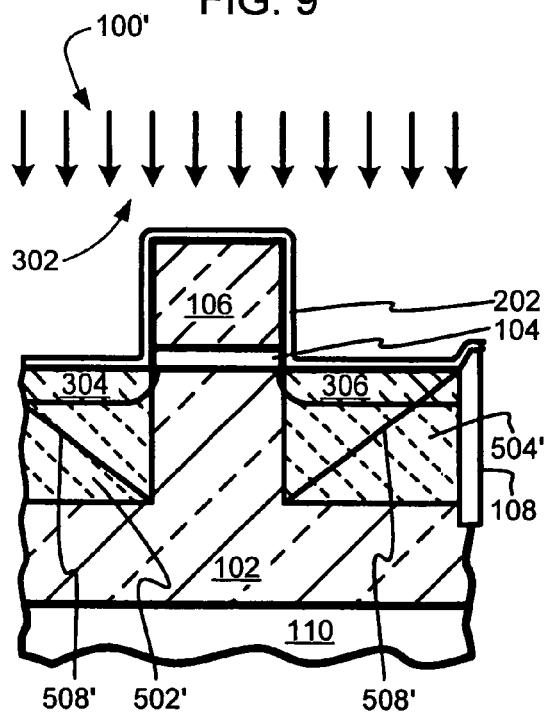
Figure 12:
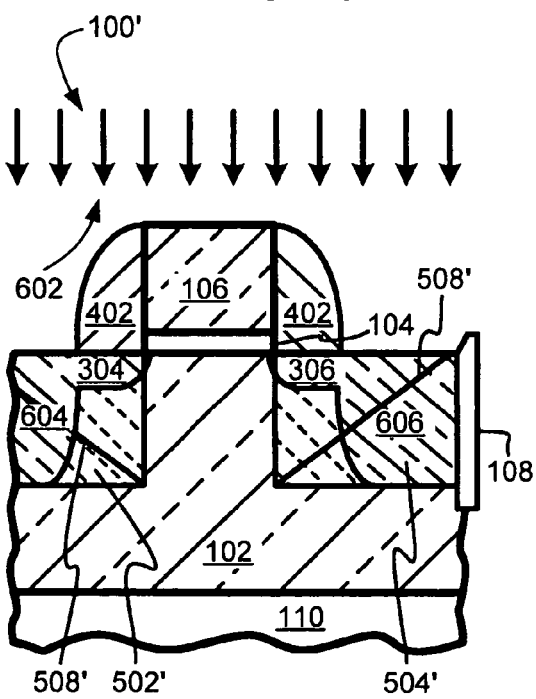

Referring now to FIGS. 10, 11, and 12, therein is shown a variation on the method for forming the deep S/D junction regions. More specifically, rather than forming the deep S/D junction regions 502 and 504 after forming the shallow S/D junctions 304 and 306, deep S/D junction regions 502' and 504' are formed first. This sequence is an alternative to the steps illustrated above in FIGS. 2–6, leading to a functionally similar transistor 100'.

Thus, as shown in FIG. 10, following formation of the gate dielectric 104, the gate 106, and the STI 108 as illustrated in FIG. 1, the semiconductor substrate 102 has been etched and filled to form the deep S/D junction regions 502' and 504' (FIG. 10). The deep S/D junction regions 502' and 504' are similar to the deep S/D junction regions 502 and 504 (FIG. 5), except that the deep S/D junction regions 502' and 504' extend away from either side of the gate 106 (FIG. 10) rather than from the sidewall spacer 402 (FIG. 5). Otherwise, the deep S/D junction regions 502' and 504' are also formed, following etching of the semiconductor substrate 102, by SEG to replace or regrow the semiconductor substrate in the etched regions 506.

Likewise, during refilling of the etched regions 506 for the deep S/D junction regions 502' and 504', the SEG regrowth rates are unequal in the horizontal and vertical directions. This unequal growth rate causes formation therein of a facet 508' containing defects in its crystalline structure. The defects in the facet 508' then serve to increase the recombination rate of excess carriers in the transistor channel, thereby reducing the carrier lifetimes and correspondingly reducing the FBE, the same as the facet 508.

FIG. 11 shows the structure of FIG. 10 after the liner layer 202 is deposited thereon, and followed by the ion implantation 302 that forms the shallow S/D junctions 304 and 306 in the deep S/D junction regions 502' and 504'. The ion implantation 302 is again followed by a high-temperature anneal above 700° C. to activate the implanted impurity atoms to form the shallow S/D junctions 304 and 306.

FIG. 12 shows the structure of FIG. 11 after removal of the liner layer 202 and deposition and forming of the curved sidewall spacer 402, followed by the ion implantation 602 to complete the formation of the deep S/D junctions 604 and 606 in the deep S/D junction regions 502' and 504'. The sidewall spacer 402, the gate 106, and the STI 108 again act as masks for the ion implantation into the deep S/D junction regions 502' and 504'. The ion implantation 602 is followed by the high-temperature anneal above 700° C. to activate the implanted impurity atoms for the deep S/D junctions 604 and 606.

The transistor 100' is then completed as described above in conjunction with FIGS. 7–9.

Figure 13:
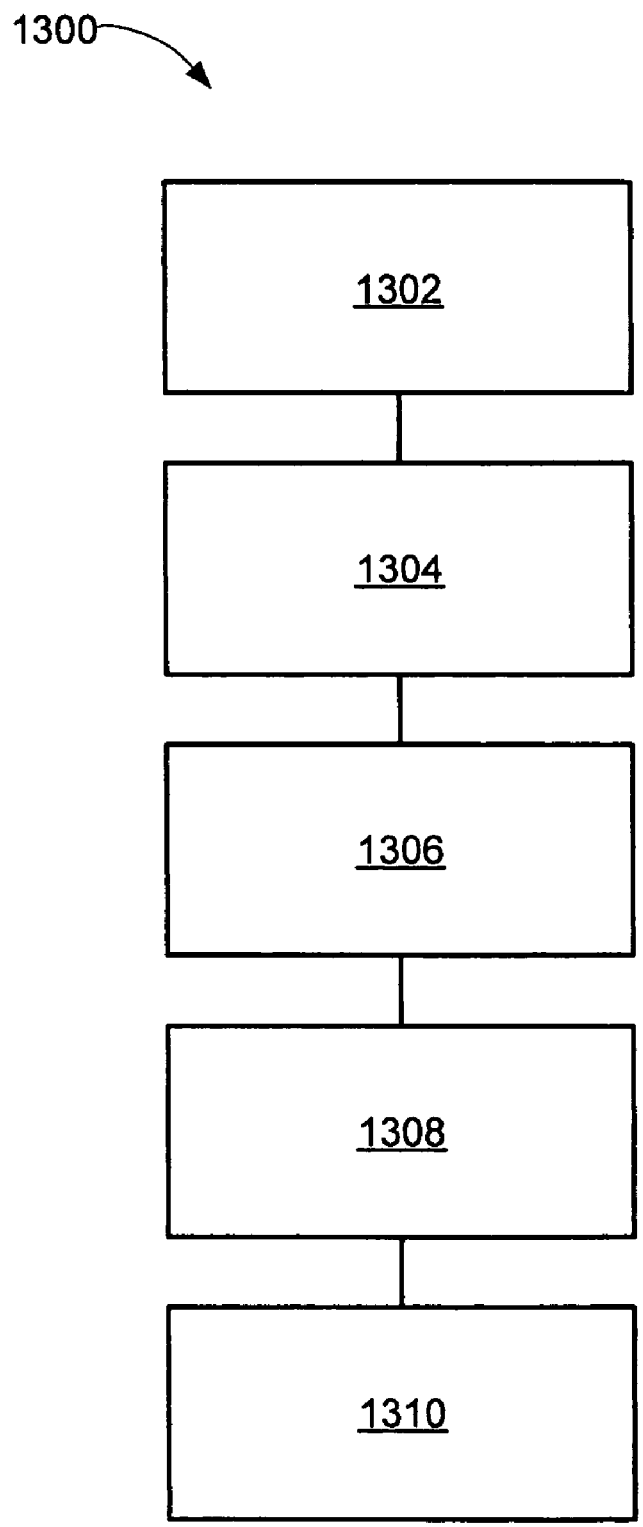
FIG. 13 is a flow chart of a method for manufacturing an integrated circuit in accordance with the present invention.

Referring now to FIG. 13, therein is shown a flow chart of a method 1300 for forming an integrated circuit in accordance with the present invention. The method 1300 includes: providing a semiconductor substrate in a step 1302; forming a gate dielectric on the semiconductor substrate in a step 1304; forming a gate on the gate dielectric in a step 1306; forming source/drain junctions in the semiconductor substrate adjacent the gate in a step 1308, and; forming a facet in at least one of the source/drain junctions of the integrated circuit in a step 1310.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations which fall within the scope of the included claims. All matters hithertofore set forth herein or shown in the accompanying drawings are to be interpreted in an illustrative and non-limiting sense.

The invention claimed is:

1. A method for forming an integrated circuit comprising:
   providing a semiconductor substrate;
   forming a gate dielectric on the semiconductor substrate;
   forming a gate on the gate dielectric;
   forming source/drain junctions in the semiconductor substrate adjacent the gate; and
   forming a facet in at least one of the source/drain junctions of the integrated circuit.

2. The method of claim 1 wherein forming the facet further comprises:
   etching the semiconductor substrate; and
   filling crystalline material in the etched region.

3. The method of claim 1 wherein forming the facet further comprises:
   etching the semiconductor substrate; and
   filling crystalline material in the etched region after forming the source/drain junctions.

4. The method of claim 1 wherein forming the facet further comprises:
   etching the semiconductor substrate; and
   filling crystalline material in the etched region before forming the source/drain junctions.

5. The method of claim 1 wherein forming the facet further comprises:
   etching the semiconductor substrate; and
   filling doped crystalline material in the etched region.

6. A method for forming an integrated circuit comprising:
   providing a semiconductor substrate;
   forming a gate dielectric on the semiconductor substrate;
   forming a gate on the gate dielectric;
   forming source/drain junctions in the semiconductor substrate adjacent the gate;
   forming deep source/drain junctions in the semiconductor substrate for the source/drain junctions;
   forming a facet in at least one of the source/drain junctions and the deep source/drain junctions;
   forming a silicide on the deep source/drain junctions and on the gate;
   depositing an interlayer dielectric above the semiconductor substrate; and
   forming contacts in the interlayer dielectric to the silicide.

7. The method of claim 6 wherein forming the facet further comprises:
   etching the semiconductor substrate; and
   filling crystalline material in the etched region by selective epitaxial growth.

8. The method of claim 6 wherein forming the facet further comprises:
   etching the semiconductor substrate; and
   filling crystalline material in the etched region by selective epitaxial growth after forming the source/drain junctions.

9. The method of claim 6 wherein forming the facet further comprises:
   etching the semiconductor substrate; and
   filling crystalline material in the etched region by selective epitaxial growth before forming the source/drain junctions.

10. The method of claim 6 wherein forming the facet further comprises:
   etching the semiconductor substrate; and
   filling doped crystalline material in the etched region by selective epitaxial growth.

11. An integrated circuit comprising:
   a semiconductor substrate;
   a gate dielectric on the semiconductor substrate;
   a gate on the gate dielectric;
   source/drain junctions in the semiconductor substrate adjacent the gate; and
   a facet in at least one of the source/drain junctions of the integrated circuit.

12. The integrated circuit of claim 11 wherein the facet is formed by etching the semiconductor substrate and filling crystalline material in the etched region.

13. The integrated circuit of claim 11 wherein the facet is formed by etching the semiconductor substrate and filling crystalline material in the etched region after forming the source/drain junctions.

14. The integrated circuit of claim 11 wherein the facet is formed by etching the semiconductor substrate and filling crystalline material in the etched region before forming the source/drain junctions.

15. The integrated circuit of claim 11 wherein the facet is formed by etching the semiconductor substrate and filling doped crystalline material in the etched region.

16. An integrated circuit comprising:
   a semiconductor substrate;
   a gate dielectric on the semiconductor substrate;
   a gate on the gate dielectric;
   source/drain junctions in the semiconductor substrate adjacent the gate;
   deep source/drain junctions in the semiconductor substrate for the source/drain junctions;
   a facet in at least one of the source/drain junctions and the deep source/drain junctions;
   a silicide on the deep source/drain junctions and on the gate;
   an interlayer dielectric above the semiconductor substrate; and
   contacts in the interlayer dielectric to the silicide.

17. The integrated circuit of claim 16 wherein the facet is formed by etching the semiconductor substrate and filling crystalline material in the etched region by selective epitaxial growth.

18. The integrated circuit of claim 16 wherein the facet is formed by etching the semiconductor substrate and filling crystalline material in the etched region by selective epitaxial growth after forming the source/drain junctions.

19. The integrated circuit of claim 16 wherein the facet is formed by etching the semiconductor substrate and filling crystalline material in the etched region by selective epitaxial growth before forming the source/drain junctions.

20. The integrated circuit of claim 16 wherein the facet is formed by etching the semiconductor substrate and filling doped crystalline material in the etched region by selective epitaxial growth.

* * * * *